(12) United States Patent
Kawakami

(10) Patent No.: US 12,300,588 B2
(45) Date of Patent: May 13, 2025

(54) SEMICONDUCTOR MODULE AND METHOD FOR FABRICATING THE SAME

(71) Applicant: FUJI ELECTRIC CO., LTD., Kanagawa (JP)

(72) Inventor: Yoshihiko Kawakami, Chino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 548 days.

(21) Appl. No.: 17/700,537

(22) Filed: Mar. 22, 2022

(65) Prior Publication Data

US 2022/0384321 A1 Dec. 1, 2022

(30) Foreign Application Priority Data

May 31, 2021 (JP) ................................. 2021-090854

(51) Int. Cl.
| | | |
|---|---|---|
| *H01L 21/48* | (2006.01) | |
| *B23K 26/21* | (2014.01) | |
| *H01L 23/498* | (2006.01) | |
| *H05K 3/32* | (2006.01) | |
| *B23K 101/38* | (2006.01) | |

(52) U.S. Cl.
CPC ........ *H01L 23/49811* (2013.01); *B23K 26/21* (2015.10); *H01L 21/4853* (2013.01); *H05K 3/328* (2013.01); *B23K 2101/38* (2018.08)

(58) Field of Classification Search
None
See application file for complete search history.

(56) References Cited

U.S. PATENT DOCUMENTS

| | | | | |
|---|---|---|---|---|
| 5,829,125 A | * | 11/1998 | Fujimoto | ................. H01L 24/05 219/121.64 |
| 2007/0172980 A1 | * | 7/2007 | Tanaka | .................... H01L 24/84 257/E23.044 |
| 2010/0295187 A1 | * | 11/2010 | Tsuruoka | ................ H01L 24/37 438/126 |
| 2022/0246577 A1 | * | 8/2022 | Guillon | ................... H01L 24/48 |
| 2023/0369183 A1 | * | 11/2023 | Kawakami | .............. H01L 24/41 |

FOREIGN PATENT DOCUMENTS

| | | |
|---|---|---|
| JP | H1022328 A | 1/1998 |
| JP | H11354660 A | 12/1999 |

* cited by examiner

*Primary Examiner* — Benjamin P Sandvik

(57) ABSTRACT

Provided is a semiconductor module including: a layered substrate on which a semiconductor chip is provided; and a connection terminal including a connection portion connected to the layered substrate, wherein the connection portion includes at least one ultrasonic connection section, and at least one laser-welded section, at least a portion of which is provided at a location other than a location at which the ultrasonic connection section is provided. The at least one ultrasonic connection section may be provided to be closer to the leading end of the connection portion than the at least one laser-welded section is.

18 Claims, 17 Drawing Sheets a-a FIG.3

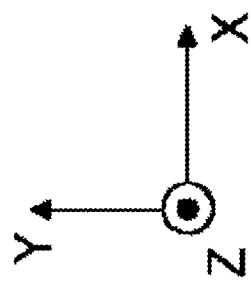
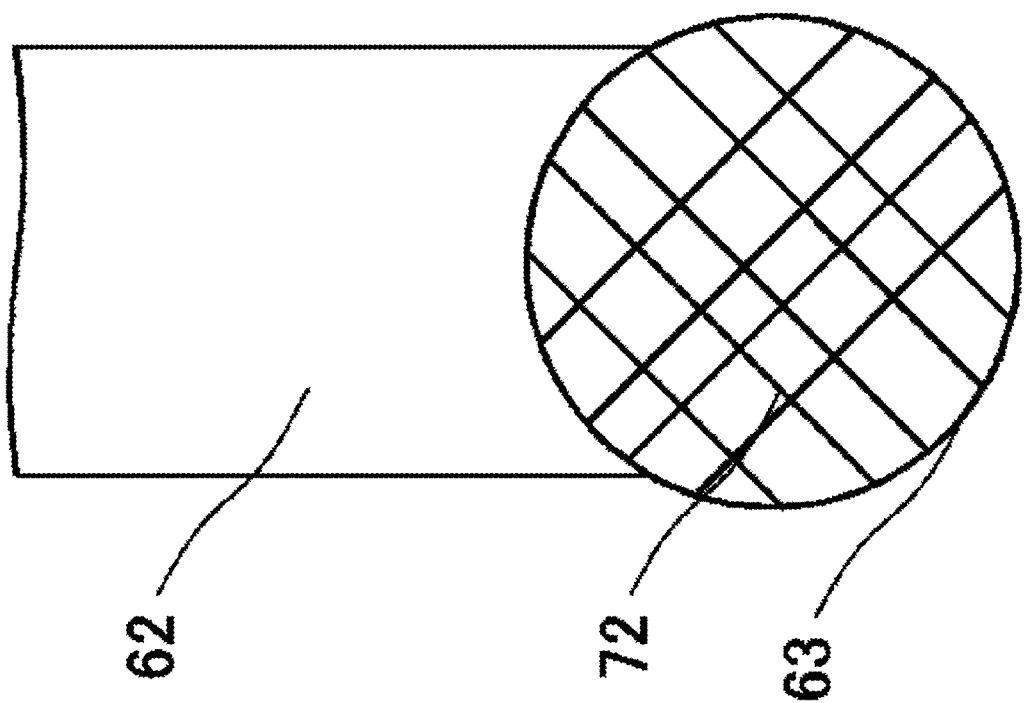
FIG.4 a-a

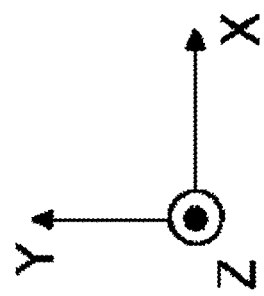
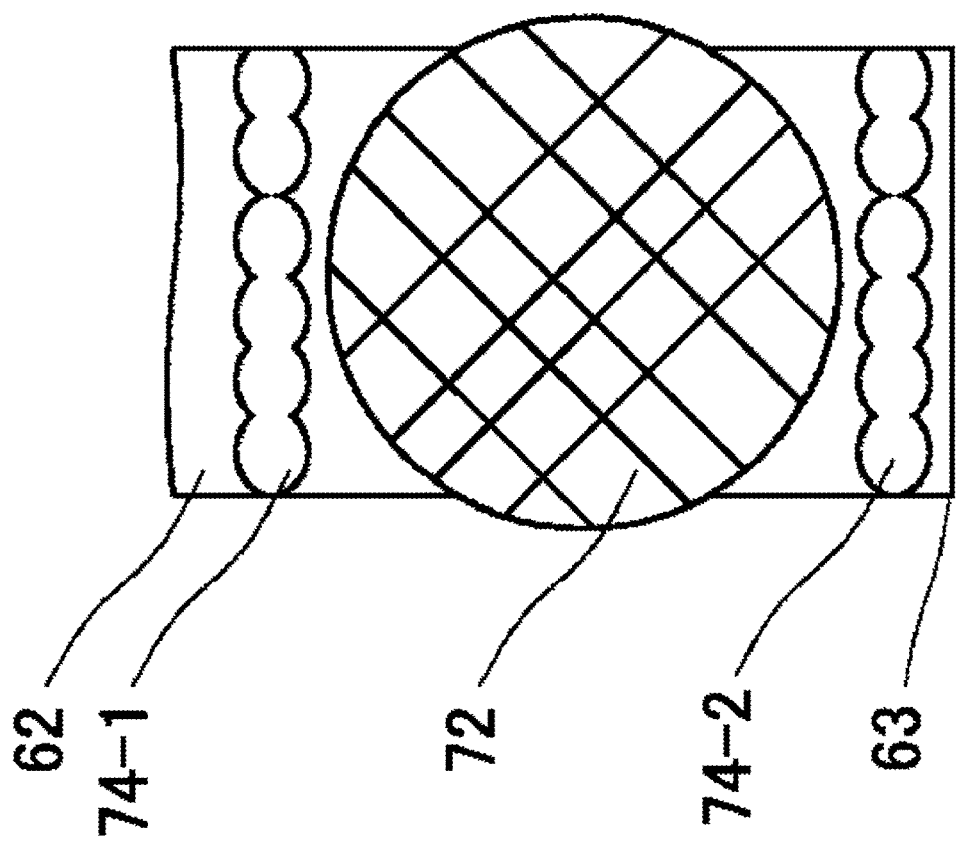
FIG.8

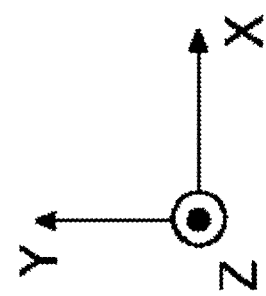
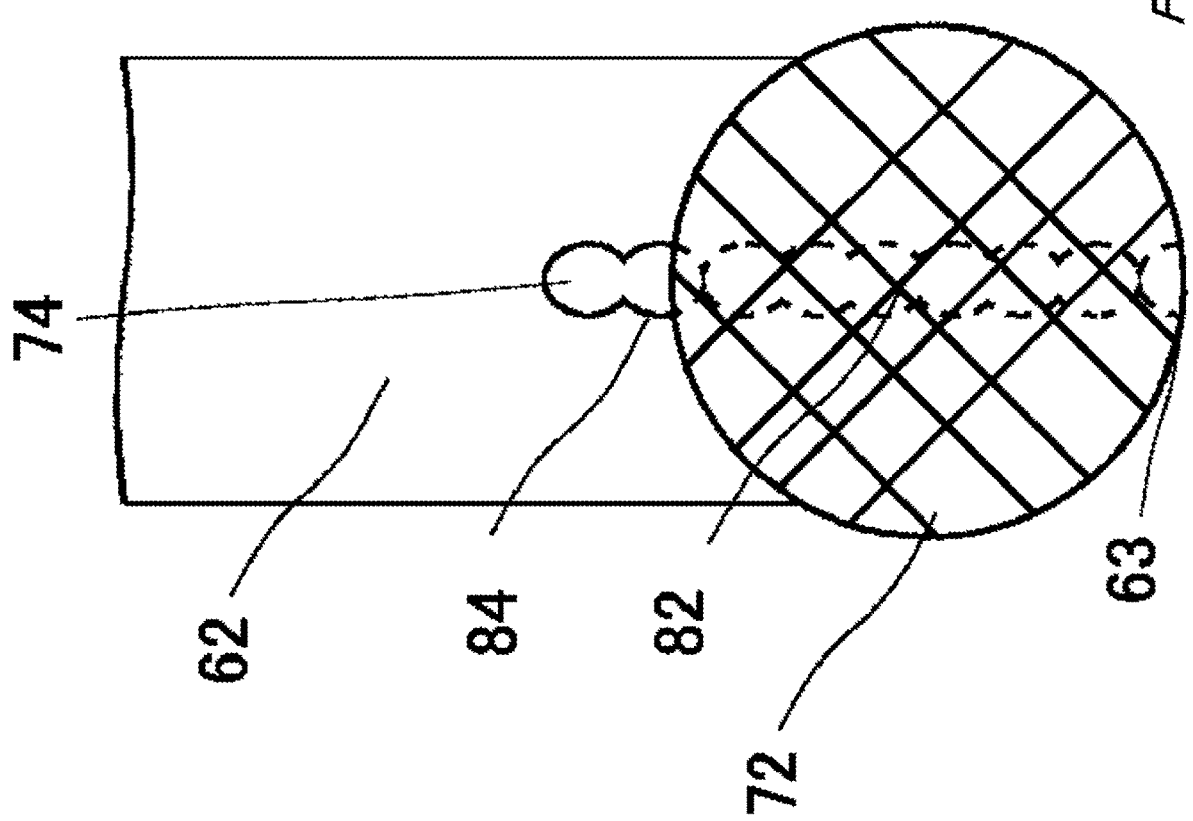
FIG. 12

SEMICONDUCTOR MODULE AND METHOD FOR FABRICATING THE SAME

The contents of the following Japanese patent application are incorporated herein by reference:
NO. 2021-090854 filed in JP on May 31, 2021.

BACKGROUND

1. Technical Field

The present invention relates to a semiconductor module and a method for fabricating the same.

2. Related Art

A conventionally known bonding method includes "a first bonding process for temporarily fitting a first member to a second member at bonding sites by ultrasonic welding, and a second bonding process for laser-welding, after the first bonding process, the first member to the second member by irradiating the bonding sites with laser light (see, for example, patent document 1). A hermetic sealing method is also known wherein "a metal lid is positioned to be fixed to a ceramic package by ultrasonic welding, and then the perimeter of the main surface of the metal lid is welded with an electron beam for hermetic sealing" (see, for example, patent document 2).

PRIOR ART DOCUMENT

Patent Document

Patent Document 1: Japanese Patent Application Publication No. H10-22328
Patent Document 2: Japanese Patent Application Publication No. H11-354660

BRIEF DESCRIPTION OF THE DRAWINGS

FIG. 4 shows an example of a connection terminal 52 in FIG. 3 as seen in a top view.
FIG. 8 shows an example of a connection terminal 52 in FIG. 7 as seen in a top view.
FIG. 12 shows an example of a connection terminal 52 in FIG. 11 as seen in a top view.

DESCRIPTION OF EXEMPLARY EMBODIMENTS

The following describes the present invention by referring to embodiments thereof. However, the embodiments described hereinafter do not limit the invention as in the claims. Not all of the combinations of features described in the embodiments are necessarily essential for the solution of the invention.

One side in a direction parallel to the depth direction of a semiconductor module is referred to an "upper" side herein, and the other side is referred to as a "lower" side herein. One of the two main surfaces of a substrate, a layer, or another member is referred to as an upper surface, and the other surface is referred to as a lower surface. The "upper" or "lower" direction is not limited to a gravity direction or to the direction of attachment of a semiconductor chip to a substrate or the like when mounting the semiconductor chip.

Figure 1:
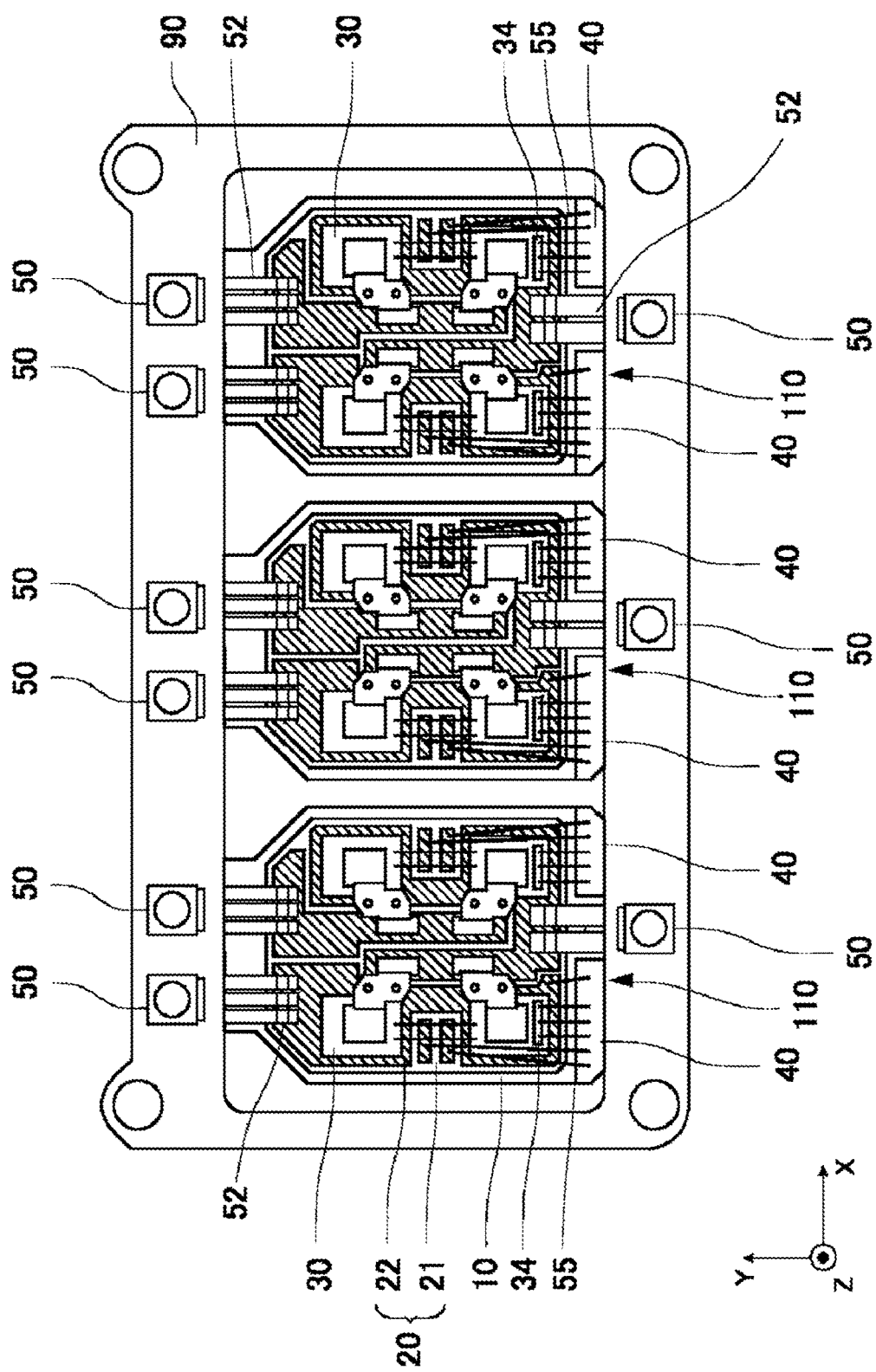
FIG. 1 is an example of a top view of a semiconductor module 100.

FIG. 1 is an example of a top view of a semiconductor module 100. The semiconductor module 100 includes bases 10, layered substrates 20, semiconductor chips 30, semiconductor assemblies 110, printed circuit boards (PCBs) 40, and a housing 90. The layered substrates 20 are provided above the bases 10. The semiconductor chips 30 are provided above the layered substrates 20. The semiconductor assembly 110 includes the semiconductor chips 30. The PCBs 40 are provided above the semiconductor assemblies 110. The housing 90 is provided to surround side edge portions of the bases 10.

The longer edge direction and the shorter edge direction of the rectangular housing 90 as seen in the top view of FIG. 1 are respectively defined as an X axis and a Y axis herein. A direction that forms a right-handed system together with the X-axis direction and the Y-axis direction and that is also the direction of the side of the semiconductor module 100 on which the semiconductor assemblies 110 are installed is defined as a Z-axis direction. Note that the top view corresponds to the direction in which the semiconductor module 100 is seen from the positive direction in the Z axis.

The housing 90 is provided on outer edge portions of the bases 10 so as to surround the plurality of semiconductor assemblies 110. The housing 90 is formed from, for example, polyphenyl sulfide (PPS), polybutylene terephthalate (PBT), polybutyl acrylate (PBA), polyamide (PA), acrylonitrile-butadiene-styrene (ABS), liquid crystal polymer (LCP), polyether ether ketone (PEEK), polybutylene succinate (PBS), urethane, or silicone. In this example, the housing 90 is formed from a PPS resin, i.e., a heat-resistant resin.

The base 10 is a semiconductor-cooling base for dissipating heat generated by the semiconductor assembly 110. The base 10 is formed from a metal having high heat conductivity. As an example, the base 10 may be formed from a metal such as copper, aluminum, iron, or an alloy thereof.

A cooler is provided below the base 10. As an example, the cooler may include a heat sink provided with a plurality of fins. The cooler may be a cooling apparatus that performs cooling by causing a cooling liquid to flow between the plurality of fins. As an example, the cooler may be formed from a metal such as copper, aluminum, iron, or an alloy thereof.

As an example, a bonding layer containing a thermal compound may be provided between the cooler and the base 10. The bonding layer may be formed from organic oil containing a filler of, for example, alumina that has high heat conductivity. In another example, the cooler and the base 10 may be integrally molded of metal. In this case, the base 10 forms the upper surface of the cooler.

The layered substrate 20 may be, for example, a direct-copper-bonding (DCB) substrate or an active-metal-blazed (AMB) substrate. In this example, the layered substrate 20 is a DCB substrate.

The layered substrate 20 has a structure in which a metal plate 22 is directly bonded to an insulation plate 21 such that the insulation plate 21 is sandwiched in the up-down direction. Through solder bonding using lead-free solder, the layered substrate 20 may be installed above the base 10 with a bonding material therebetween.

The insulation plate 21 contains a material with high heat conductivity and a low dielectric loss. As an example, the insulation plate 21 may contain a ceramic material of, for example, alumina, aluminum nitride, or silicon nitride. The metal plate 22 is formed from a metal such as copper or aluminum. Especially when the layered substrate 20 is a DCB substrate, the metal plate 22 is formed from copper or a copper alloy.

As an example, a semiconductor chip 30 includes: a switching device such as a power metal oxide semiconductor field effect transistor (power MOSFET), an insulated gate bipolar transistor (IGBT), or a reverse conducting IGBT (RC-IGBT); and a reflux diode such as a freewheeling diode (FWD). The semiconductor chip 30 may be fabricated using a semiconductor substrate of, for example, silicon, silicon carbide, or gallium nitride. The entirety of a semiconductor module 100 that is provided with a semiconductor assembly 110 including a plurality of semiconductor chips 30 can form a power device for, for example, an inverter or an intelligent power module (IPM) including a control circuit. The semiconductor chips 30 are provided above layered substrates 20, in particular provided on the upper surfaces of metal plates 22. Solder bonding using lead-free solder as a bonding material may be interposed between the semiconductor chips 30 and the metal plates 22, as in the space between the base 10 and the layered substrates 20.

A PCB 40 includes a wiring layer connected to a control electrode 34 for the switching device of a semiconductor chip 30. As an example, the PCB 40 may be electrically connected to the semiconductor chip 30 by a bonding wire 55. As an example, the PCB 40 may be provided as a polyimide film substrate or epoxy film substrate on which a wiring layer is provided. The PCB 40 may be provided on a shelf-like portion of a wall surface of the housing 90, the shelf-like portion being located above the semiconductor chip 30 and protruding toward the semiconductor assembly 110.

One or more external connection parts 50 are provided around each semiconductor assembly 110. As an example, when the semiconductor module 100 is a three-phase inverter, three external connection parts 50 may be provided for each single semiconductor assembly 110 as load terminals and power supply terminals for driving a U phase, a V phase, and a W phase. The external connection parts 50 may be coated with nickel plating. Connecting copper bus bars to the external connection parts 50 allows a large current to be applied to each of the connection terminals 52 of the semiconductor assembly 110.

A connection terminal 52 is electrically connected to an external connection part 50. In this example, a plurality of connection terminals 52 are provided for each single external connection part 50. In FIG. 1, two or three connection terminals 52 are provided for each single external connection part 50. Alternatively, one connection terminal 52 may be provided for each single external connection part 50. A connection terminal 52 and an external connection part 50 may be connected by welding or by using a bonding material, or may be formed from one metal plate. Connection terminals 52 are provided for each semiconductor assembly 110 as terminals for external connection in order to supply a voltage for driving individual elements of semiconductor chips 30.

Figure 2:
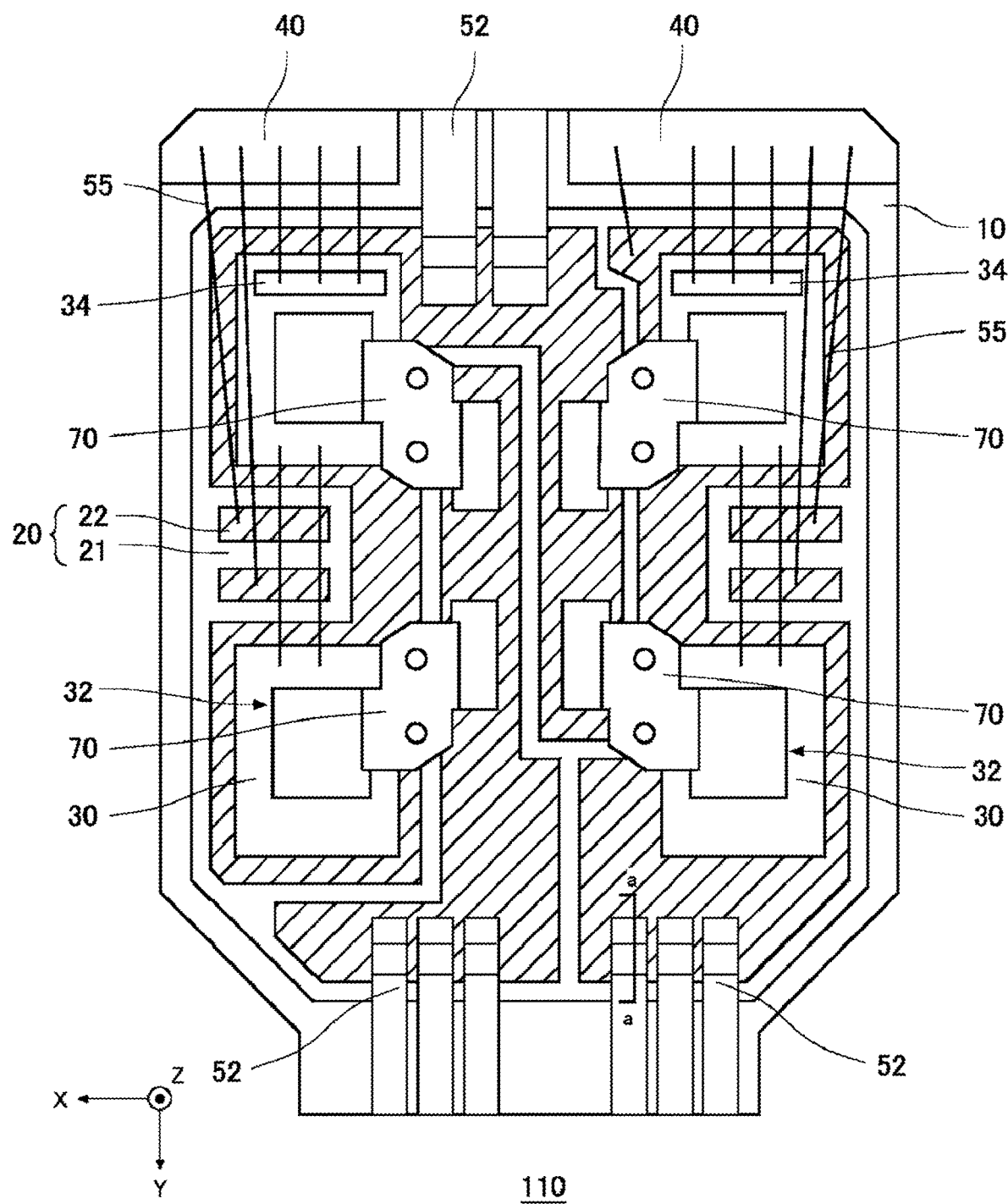
FIG. 2 is an example of a top view of a semiconductor assembly 110.

FIG. 2 is an example of a top view of a semiconductor assembly 110. The semiconductor assembly 110 in this example includes layered substrates 20 and two pairs of semiconductor chips 30, i.e., four semiconductor chips 30, equipped on the layered substrates 20. The semiconductor chips 30 are electrically connected to connection terminals 52 for external connection. The semiconductor assembly 110 may include metal wiring plates 70 for electrically connecting the semiconductor chips 30 to the connection terminals 52. Instead of using the metal wiring plates 70, the semiconductor chips 30 may be electrically connected to the connection terminals 52 by conductive members such as wires or ribbons. In this example, the connection terminals 52 are connected to the metal plates 22 by a bonding material. The semiconductor assembly 110 may include blocks (not shown) provided on the metal plates 22. The connection terminals 52 may be connected to the metal plates 22 via the blocks. The blocks may be formed from a metal material of, for example, copper or a copper alloy. The metal plates 22 may include main circuit sections to which the semiconductor chips 30 and the metal wiring plates 70 are connected, and control circuit sections to which the control electrodes 34 are connected.

An upper main electrode 32 for external connection and a control electrode 34 for controlling a principal current are provided on the upper surface of a semiconductor chip 30. The upper main electrode 32 may contain aluminum, nickel, or an alloy containing at least either thereof. When the semiconductor chip 30 includes a vertical switching device, the semiconductor chip 30 may include an upper main electrode 32 on the upper-surface side and a lower main electrode (not shown) on the opposite side from the upper main electrode 32. When the switching device is an IGBT element, the upper main electrode 32 may be an emitter electrode, and the lower main electrode may be a collector electrode. The control electrode 34 may include a gate electrode or may be various sensing electrodes such as an emitter sensing electrode, a temperature sensing electrode, and a current sensing electrode.

The upper main electrode 32 and the metal plate 22 may be electrically connected by the metal wiring plate 70. The upper main electrode 32 and the metal wiring plate 70 may be soldered to each other by lead-free solder.

As an example, the metal wiring plate 70 may be formed from a highly conductive material such as aluminum, copper, or an alloy containing at least aluminum or copper. The metal wiring plate 70 may be formed from a lead frame. The metal wiring plate 70 may include an end section connected to the metal plate 22, an end section connected to the upper main electrode 32, and a linking section connecting the two end sections. The linking section may have a rectangular shape when seen in the Y-axis direction.

The PCB 40 includes a wiring layer. A control terminal (not shown) and a bonding wire 55 are connected to the wiring layer. The semiconductor chip 30 may be controlled by various signals generated by a control circuit via the PCB 40. The semiconductor chip 30 may include a gate electrode and various sensing electrodes. The sensing electrodes may also be connected to the control circuit via the bonding wire 55 and the PCB 40. The current of a control signal may be smaller than a current flowing through the connection terminal 52.

As in this example, the PCB 40 may be divided by connection terminals 52 into a plurality of separate pieces. When seen in a top view, portions of the base 10 may be exposed in portions of the spaces between a plurality of PCBs 40.

Figure 3:
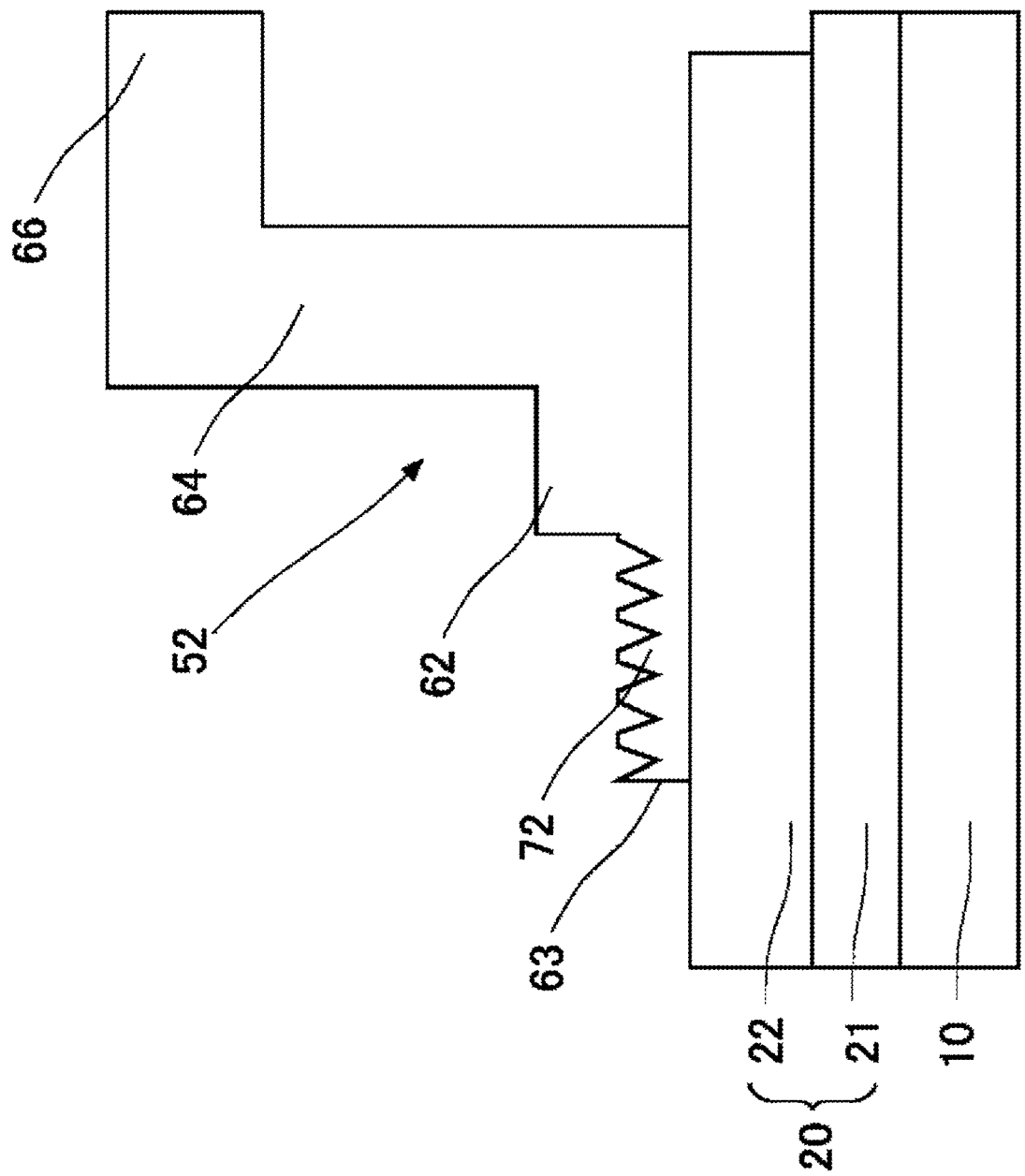
FIG. 3 shows a comparative example of an a-a cross section of FIG. 2.

FIG. 3 shows a comparative example of the a-a cross section of FIG. 2. The a-a cross section is a XZ plane passing through one connection terminal 52. The dimension in FIG. 3 is not necessarily the same as that in FIG. 2. The semiconductor module 100 in this example includes, on this cross section, a base 10, a layered substrate 20, and a connection terminal 52.

The connection terminal 52 in this example includes a connection portion 62, a leg section 64, and an extension section 66. The connection portion 62 is connected to the layered substrate 20. The connection portion 62 may be a plate-shaped portion substantially parallel to a XY plane. Thus, the connection portion 62 may be a plate-shaped portion substantially parallel to the upper surface of a semiconductor chip 30. The expression "substantially parallel" indicates, for example, a state in which an angle of 10° or smaller is formed.

The leg section 64 is a portion extending in a Z-axis direction (height direction). The extension section 66 extends in the Y-axis direction. Although omitted in FIG. 3, the extension section 66 is connected to an external connection part 50. Thus, the extension section 66 connects the external connection part 50 and the connection portion 62 to each other via the leg section 64. The extension section 66 is provided above the layered substrate 20. A leading end 63 of the connection portion 62 is an end portion on the opposite side from the leg section 64. Thus, the leading-end-63 side of the connection portion 62 is the opposite side from the leg-section-64 side of the connection portion 62.

In this example, the connection portion 62 includes at least one ultrasonic connection section 72. The ultrasonic connection section 72 is a portion connected by ultrasonic bonding. In ultrasonic bonding, a vibrator applies ultrasonic vibrations to bonding faces, such that the bonding faces rub against each other and are thus plastically deformed to be bonded to each other. In this example, the connection portion 62 and the layered substrate 20 are bonded to each other by ultrasonic vibrations. As shown in FIG. 3, the ultrasonic connection section 72 includes recesses and projections on a surface of the connection portion 62.

FIG. 4 shows an example of the connection terminal 52 in FIG. 3 as seen in a top view. FIG. 4 depicts the vicinity of the leading end 63 of the connection portion 62. As seen in this example, the ultrasonic connection section 72 may have a circular shape.

The ultrasonic connection section 72, which has been ultrasonically bonded to the layered substrate 20, may have a connection failure (peeling) thereon due to a stress and exhibit an electrical characteristic defect. Hence, the power cycle tolerance tends to decrease.

Figure 5:
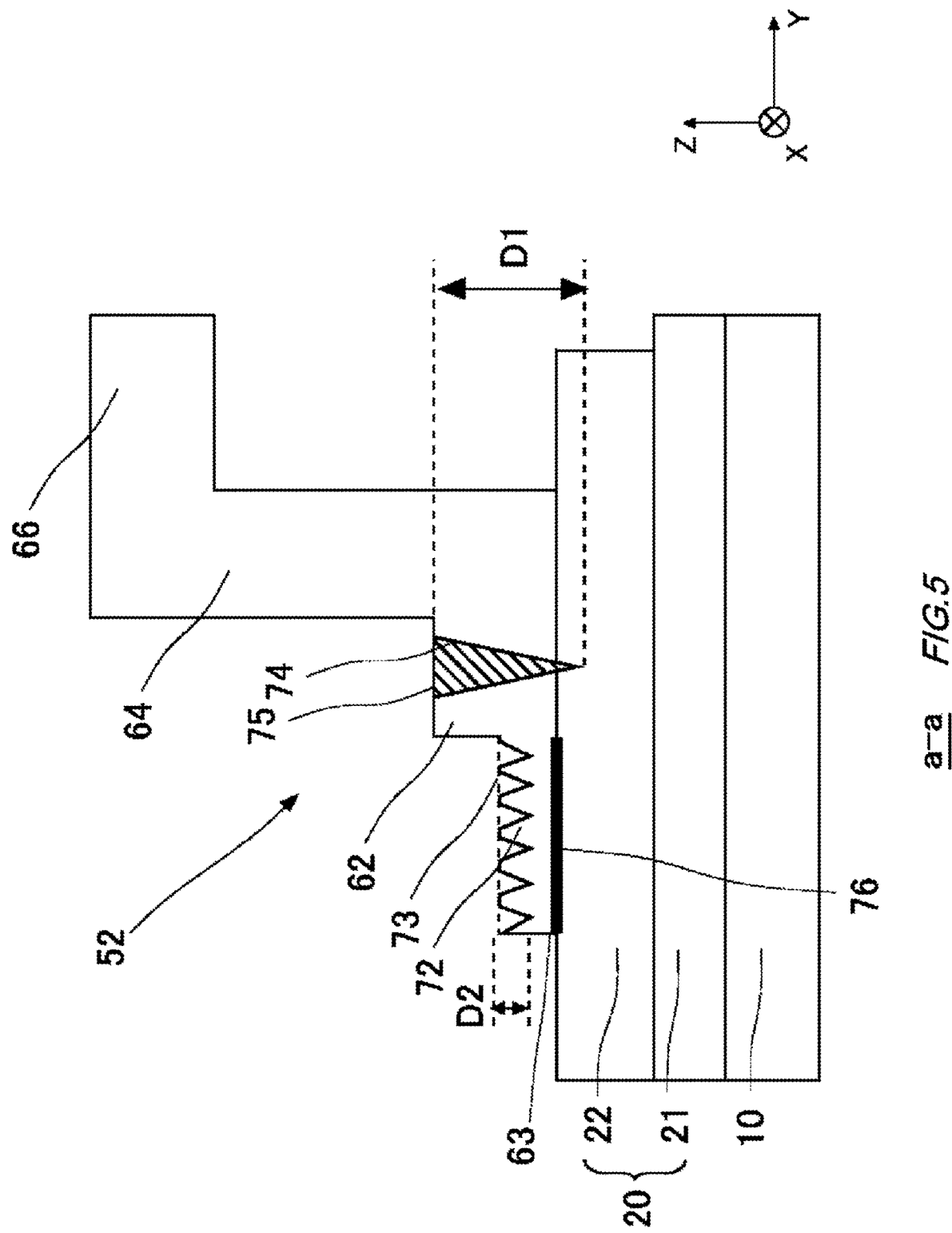
FIG. 5 shows an example of the a-a cross section of FIG. 2.
Figure 6:
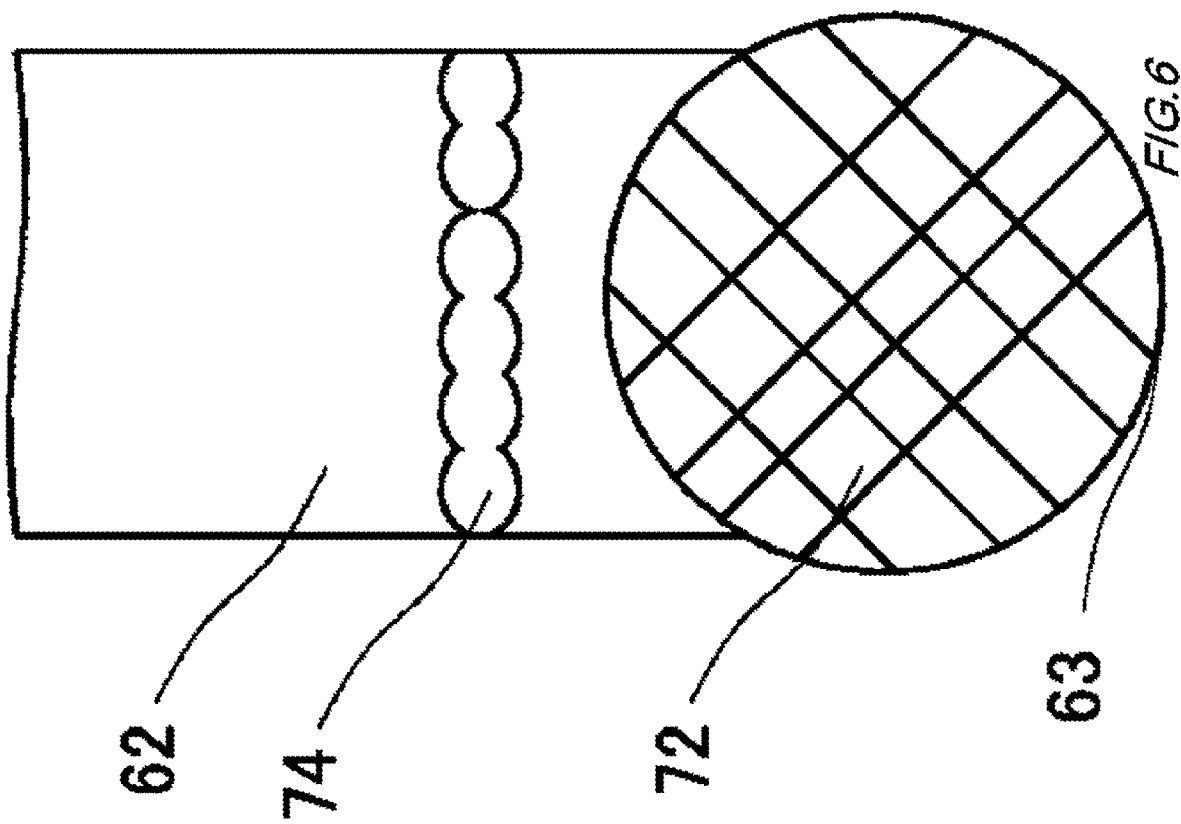
FIG. 6 shows an example of a connection terminal 52 in FIG. 5 as seen in a top view.

FIG. 5 shows an example of the a-a cross section of FIG. 2. FIG. 6 shows an example of the connection terminal 52 in FIG. 5 as seen in a top view. FIGS. 5 and 6 are different from FIGS. 3 and 4 in that the connection portion 62 includes a laser-welded section 74. The configurations in FIG. 5 other than the laser-welded section 74 may be the same as those in FIG. 3. The configurations in FIG. 6 other than the laser-welded section 74 may be the same as those in FIG. 4.

In this example, the connection portion 62 includes at least one laser-welded section 74. The laser-welded section 74 is a portion connected by laser welding. In laser welding, laser light is collected to irradiate a metal so as to locally melt the metal, and then the melted metal is solidified for welding. In this example, the connection portion 62 and the layered substrate 20 are bonded to each other by laser welding. In FIG. 5, a site at which laser welding occurs is indicated by hatching. One laser-welded section 74 herein means a section continuously extending in one direction. The laser-welded section 74 in FIG. 6 continuously extends in the X-axis direction.

The ultrasonic connection section 72 includes a connection face 76, which is indicated by a thick line in FIG. 5. In the example of FIG. 5, the connection face 76 is substantially parallel to the horizontal direction (X-axis direction or Y-axis direction). The expression "substantially parallel" may include an error of ±10° relative to "parallel." By contrast, the laser-welded section 74 has a connection face 78 (see FIG. 17), which is inclined with respect to the horizontal direction. Hence, the connection face 78 of the laser-welded section 74 includes directions different from the direction of the connection face 76 of the ultrasonic connection section 72. Thus, the connection portion 62 has high tolerance to stresses in various directions. In this example, accordingly, owing to the presence of the laser-welded section 74 in addition to the ultrasonic connection section 72, a connection failure resulting from a stress is unlikely to occur, and an interfacial fracture can be suppressed, thereby enhancing the power cycle tolerance.

Irradiating the ultrasonic connection section 72 with laser light causes scattered reflection of laser light. Hence, the laser-welded section 74, if overlapped by the ultrasonic connection section 72, could be poorly formed. Thus, at least a portion of the laser-welded section 74 is preferably provided at a location other than the location at which the ultrasonic connection section 72 is provided. In FIG. 6, the entirety of the laser-welded section 74 is provided at a location other than the location at which the ultrasonic connection section 72 is provided. In particular, the laser-welded section 74 is provided so as not to overlap the ultrasonic connection section 72.

In this example, the at least one ultrasonic connection section 72 is provided to be closer to the leading end 63 of the connection portion 62 than the at least one laser-welded section 74 is. In FIG. 6, the one ultrasonic connection section 72 is provided to be closer to the leading end 63 of the connection portion 62 than the one laser-welded section 74 is. Thus, the laser-welded section 74 is provided to be closer to the leg section 64 than the ultrasonic connection section 72 is. Since the laser-welded section 74 is provided on the leg-section-64 side, the ultrasonic connection section 72, which is provided on the leading-end-63 side, will have a reduced stress applied thereto. Accordingly, an interfacial fracture can be suppressed, and the power cycle tolerance can be enhanced.

In this example, the longitudinal direction of the laser-welded section 74 is inclined with respect to a direction to connect the leading end 63 of the connection portion 62 and the leg section 64. In FIG. 6, the longitudinal direction of the laser-welded section 74 is the X-axis direction. The direction to connect the leading end 63 of the connection portion 62 and the leg section 64 is the Y-axis direction. The longitudinal direction of the laser-welded section 74 may be substantially perpendicular to the direction to connect the leading end 63 of the connection portion 62 and the leg section 64. The expression "substantially perpendicular" may include an error of ±10° relative to "perpendicular". The laser-welded section 74 is formed by being continuously irradiated with laser light and thus has a longitudinal direction such as that in FIG. 6.

A reference plane 73 of the ultrasonic connection section 72 is positioned lower than a reference plane 75 of the laser-welded section 74. The reference planes refer to the uppermost portions of the ultrasonic connection section 72 and the laser-welded section 74. In ultrasonic bonding, as indicated above, ultrasonic waves are applied by pressing a vibrator against appropriate portions. Thus, the reference plane 73 of the ultrasonic connection section 72 is located at a low position in comparison with that before the ultrasonic connection section 72 is formed. Meanwhile, bonding is implemented by irradiating the laser-welded section 74 with laser light, so the reference plane 75 of the laser-welded section 74 exhibits no change in comparison with that before the laser-welded section 74 is formed. Thus, the ultrasonic connection section 72 and the laser-welded section 74 can be distinguished from each other according to the heights of the reference planes.

In FIG. 5, a depth D1 of a hole in the laser-welded section 74 may be greater than a depth D2 of holes in the ultrasonic connection section 72. The depth D1 of the hole in the laser-welded section 74 may be the maximum depth of the site at which laser melting occurred. Thus, the depth D1 may be the maximum depth of the site indicated by hatching. The depth D2 of the holes in the ultrasonic connection section 72 may be the maximum depth of the recesses and projections on the surface of the ultrasonic connection section 72. The depth D2 of the holes in the ultrasonic connection section 72 may be greater than the depth D1 of the hole in the laser-welded section 74.

Figure 7:
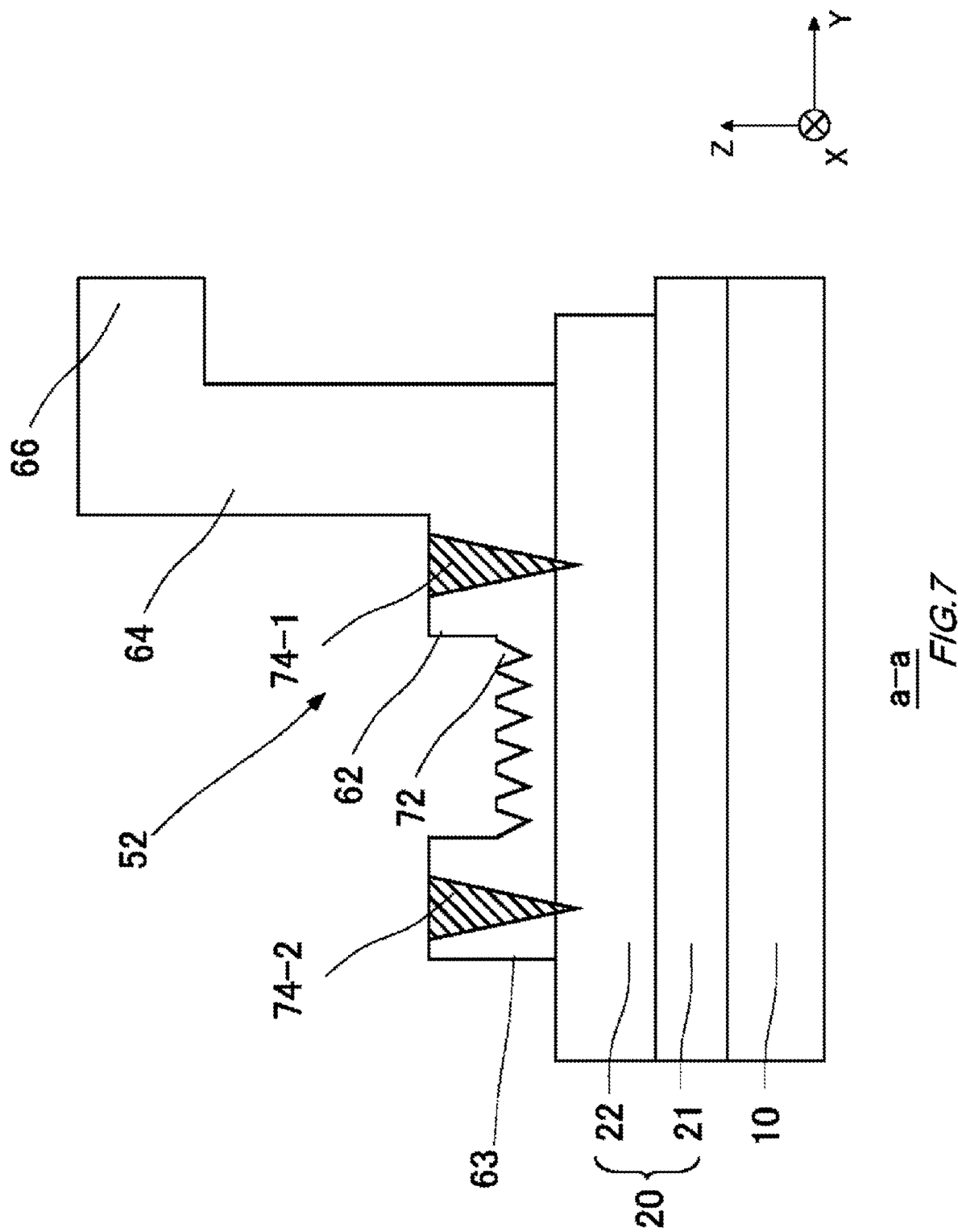
FIG. 7 shows another example of the a-a cross section of FIG. 2.

FIG. 7 shows another example of the a-a cross section of FIG. 2. FIG. 8 shows an example of the connection terminal 52 in FIG. 7 as seen in a top view. The configurations of the ultrasonic connection section 72 and the laser-welded sections 74 in FIGS. 7 and 8 are different from those in FIGS. 5 and 6. The configurations in FIG. 7 other than the ultrasonic connection section 72 and the laser-welded sections 74 may be the same as those in FIG. 5. The configurations in FIG. 8 other than the ultrasonic connection section 72 and the laser-welded sections 74 may be the same as those in FIG. 6.

In this example, the connection portion 62 includes a plurality of laser-welded sections 74. In FIGS. 7 and 8, the connection portion 62 includes laser-welded sections 74-1 and 74-2. The connection portion 62 may include three or more laser-welded sections 74.

In this example, at least one laser-welded section 74 is provided to be closer to the leading end 63 of the connection portion 62 than at least one ultrasonic connection section 72 is. In FIGS. 7 and 8, the laser-welded section 74-2 is provided to be closer to the leading end 63 of the connection portion 62 than the ultrasonic connection section 72 is. Also in such a configuration, an interfacial fracture can be suppressed, and the power cycle tolerance can be enhanced. In FIGS. 7 and 8, the laser-welded section 74-1 is provided to be closer to the leg section 64 than the ultrasonic connection section 72 is.

In this example, the plurality of laser-welded sections 74 sandwich the ultrasonic connection section 72 when seen in a top view. With respect to FIG. 8, the laser-welded sections 74-1 and 74-2 sandwich the ultrasonic connection section 72 when seen in a top view. In accordance with such a configuration, an interfacial fracture can be further suppressed, and the power cycle tolerance can be enhanced.

Figure 9:
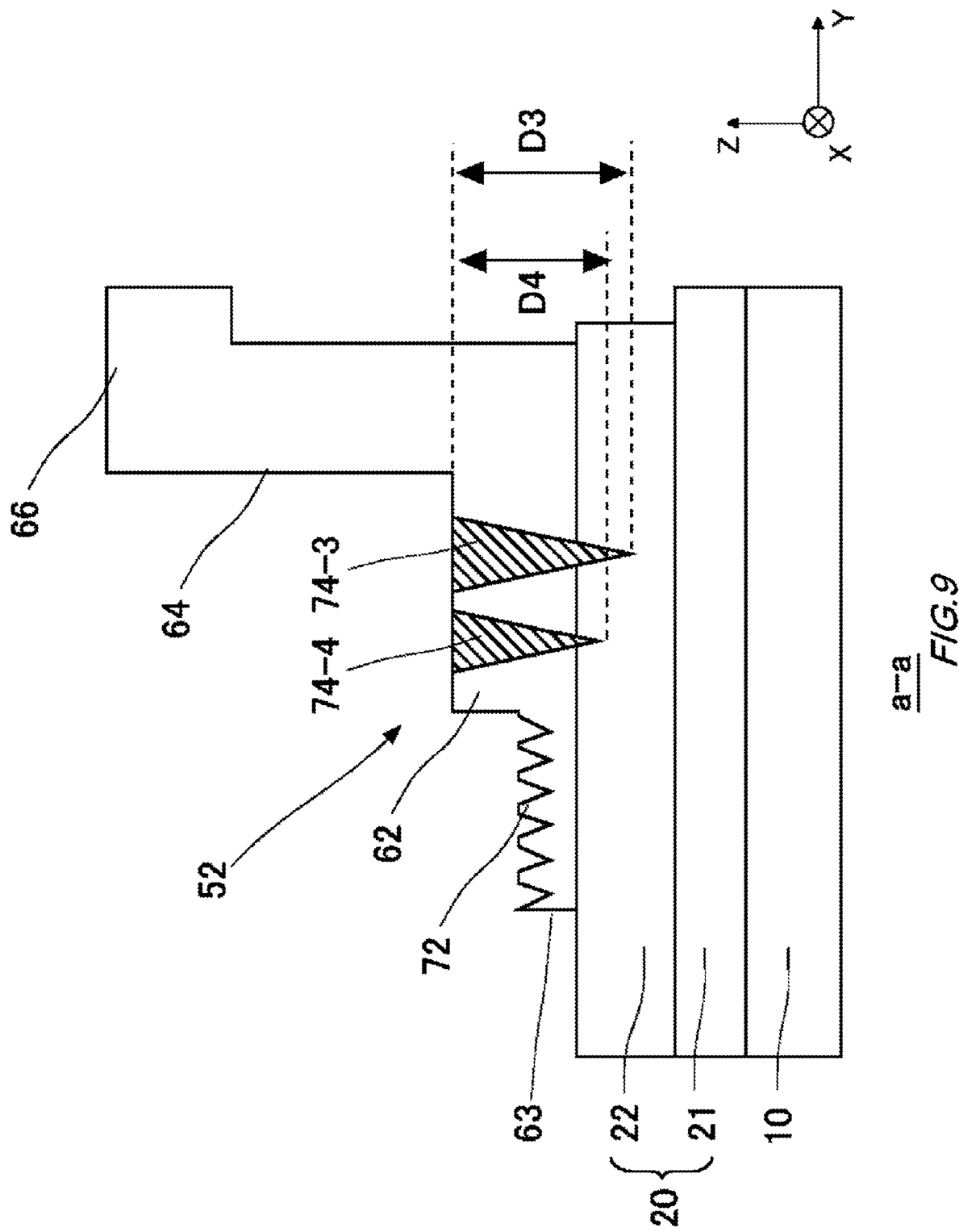
FIG. 9 shows another example of the a-a cross section of FIG. 2.
Figure 10:
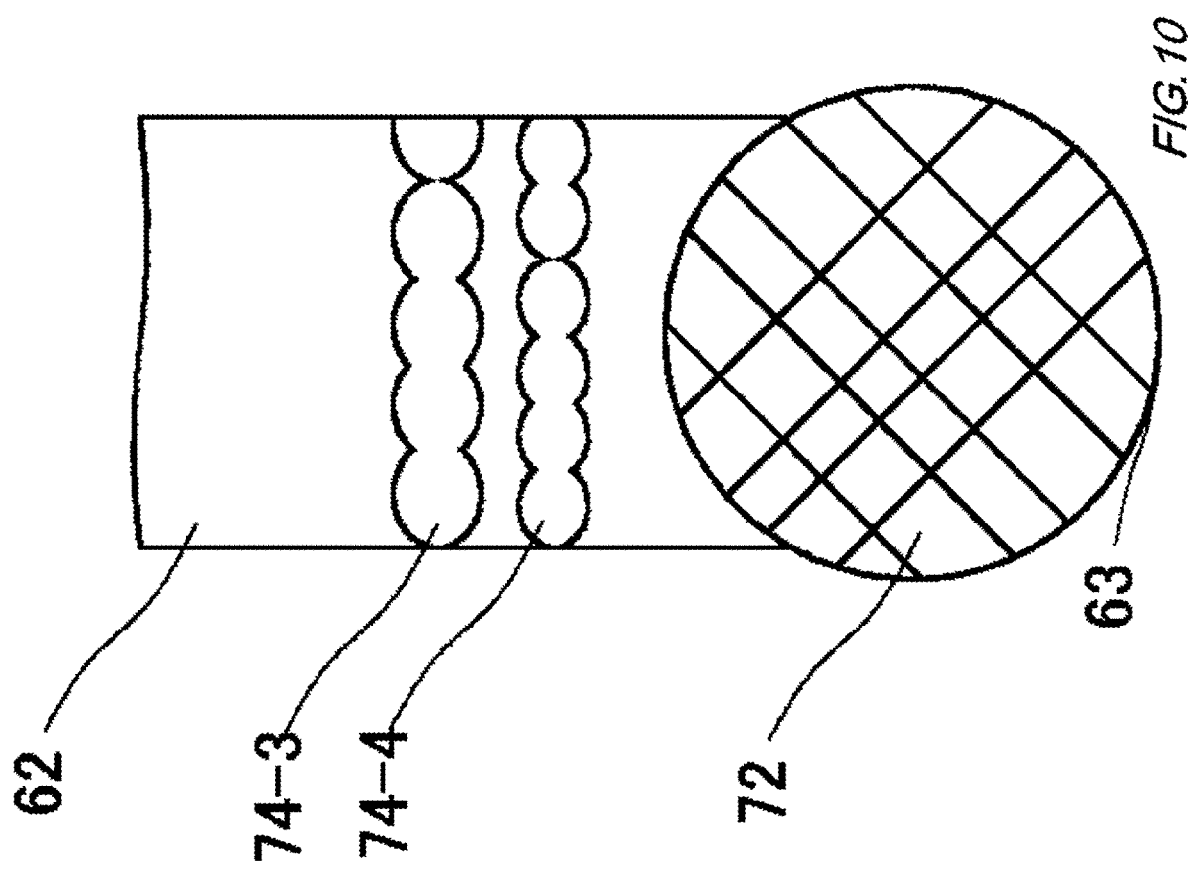
FIG. 10 shows an example of a connection terminal 52 in FIG. 9 as seen in a top view.

FIG. 9 shows another example of the a-a cross section of FIG. 2. FIG. 10 shows an example of the connection terminal 52 in FIG. 9 as seen in a top view. The configurations of the ultrasonic connection section 72 and the laser-welded sections 74 in FIGS. 9 and 10 are different from those in FIGS. 5 and 6. The configurations in FIG. 9 other than the ultrasonic connection section 72 and the laser-welded sections 74 may be the same as those in FIG. 5. The configurations in FIG. 10 other than the ultrasonic connection section 72 and the laser-welded sections 74 may be the same as those in FIG. 6.

Also in this example, the connection portion 62 includes a plurality of laser-welded sections 74. In FIGS. 9 and 10, the connection portion 62 includes laser-welded sections 74-3 and 74-4. The laser-welded sections 74-3 and 74-4 are provided to be closer to the leg section 64 than the ultrasonic connection section 72 is. Thus, the laser-welded sections 74-3 and 74-4 are provided on the side opposite to the leading end 63 with reference to the ultrasonic connection section 72.

In this example, the closer to the side opposite to the leading end 63 of the connection portion 62 the laser-welded sections 74 are provided, the deeper the holes of the laser-welded sections 74 become. In FIG. 9, a depth D3 of the hole in the laser-welded section 74-3 is greater than a depth D4 of the hole in the laser-welded section 74-4. Owing to such a configuration, the tolerance to a stress in the height direction (Z-axis direction) is high on the leg-section-64 side. Accordingly, an interfacial fracture can be further suppressed, and the power cycle tolerance can be enhanced.

Figure 11:
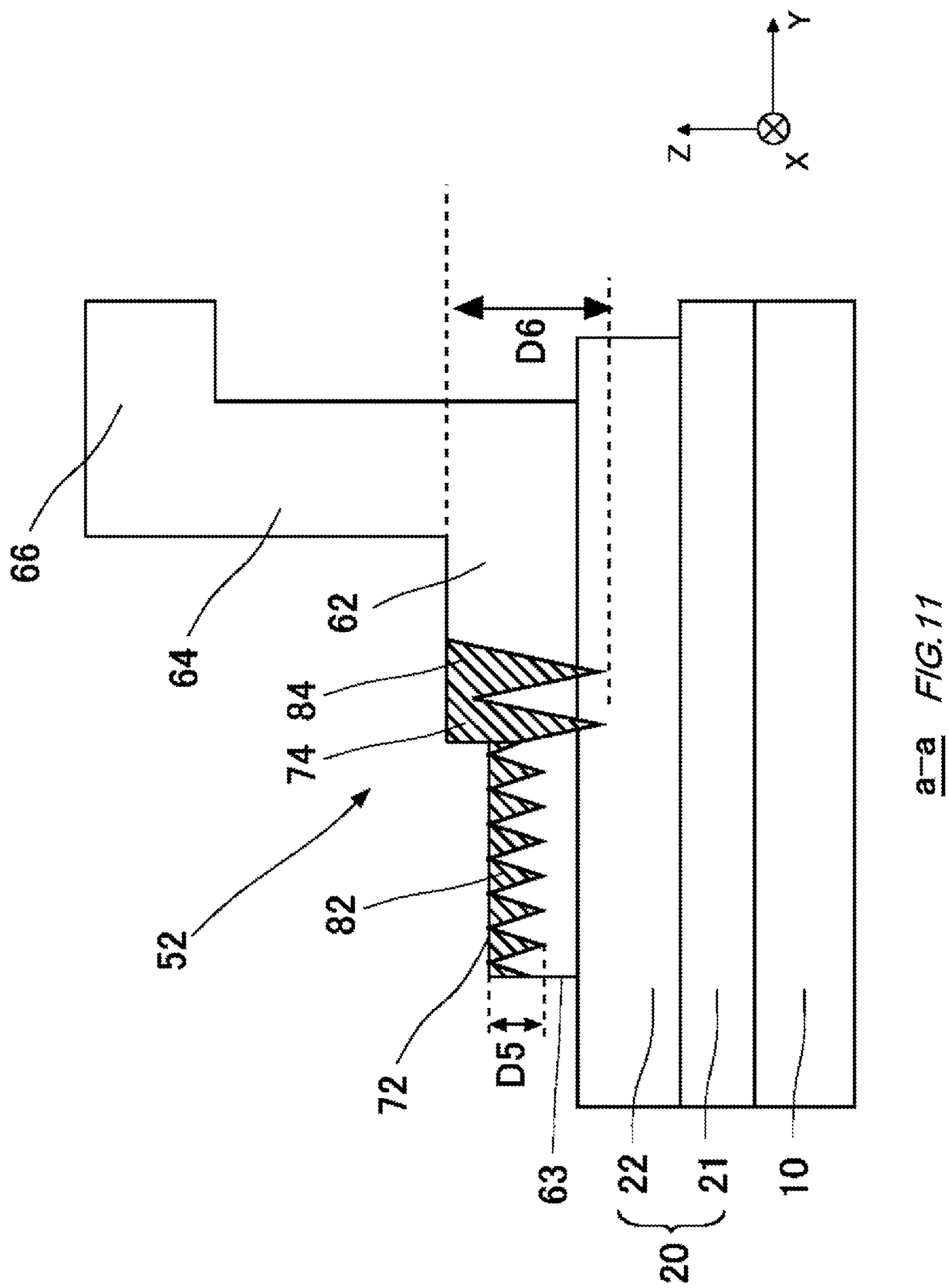
FIG. 11 shows another example of the a-a cross section of FIG. 2.

FIG. 11 shows another example of the a-a cross section of FIG. 2. FIG. 12 shows an example of the connection terminal 52 in FIG. 11 as seen in a top view. FIG. 11 depicts a cross section passing through the laser-welded section 74 in FIG. 12. The configurations of the ultrasonic connection section 72 and the laser-welded section 74 in FIGS. 11 and 12 are different from those in FIGS. 5 and 6. The configurations in FIG. 11 other than the ultrasonic connection section 72 and the laser-welded section 74 may be the same as those in FIG. 5. The configurations in FIG. 12 other than the ultrasonic connection section 72 and the laser-welded section 74 may be the same as those in FIG. 6.

In this example, the longitudinal direction of the laser-welded section 74 is substantially parallel to the direction to connect the leading end 63 of the connection portion 62 and the leg section 64. In FIG. 12, the longitudinal direction of the laser-welded section 74 is the Y-axis direction. The direction to connect the leading end 63 of the connection portion 62 and the leg section 64 is the Y-axis direction. In this way, the laser-welded section 74 may be provided to extend in the direction to connect the leading end 63 of the connection portion 62 and the leg section 64.

In FIG. 12, at least a portion of the laser-welded section 74 overlaps the ultrasonic connection section 72 when seen in a top view. In FIG. 12, the laser-welded section 74 includes a first portion 82 that overlaps the ultrasonic connection section 72 when seen in a top view. The laser-welded section 74 also includes a second portion 84 that does not overlap the ultrasonic connection section 72 when seen in a top view. When at least a portion of the laser-welded section 74 overlaps the ultrasonic connection section 72 when seen in a top view, the second portion 84 that does not overlap the ultrasonic connection section when seen in a top view may be provided, such that an interfacial fracture can be suppressed, while enhancing the power cycle tolerance. Note that the second portion 84 preferably accounts for a large proportion of the laser-welded section 74.

As shown in FIG. 11, a depth D6 of the holes in the second portion 84 is greater than a depth D5 of the holes in the first portion 82. As described above, irradiating the ultrasonic connection section 72 with laser light causes scattered reflection of laser light. Accordingly, the depth D6 of the holes in the second portion 84, which does not overlap the ultrasonic connection section 72 when seen in a top view, is greater than the depth D5 of the holes in the first portion 82, which overlaps the ultrasonic connection section 72 when seen in a top view.

Figure 13:
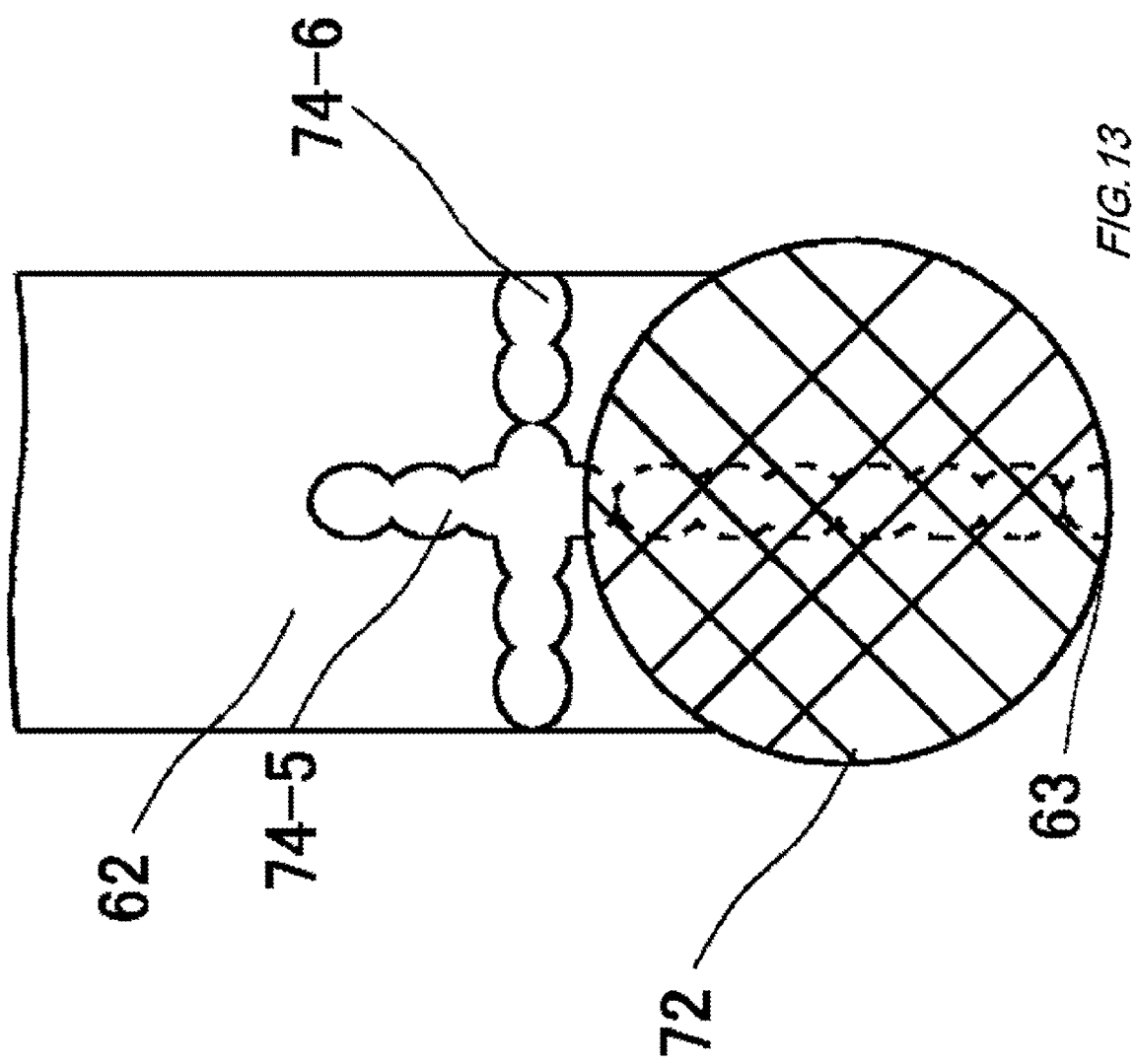
FIG. 13 shows another example of a connection terminal 52 as seen in a top view.

FIG. 13 shows another example of the connection terminal 52 as seen in a top view. The configurations of the ultrasonic connection section 72 and the laser-welded sections 74 in FIG. 13 are different from those in FIG. 6. The configurations in FIG. 13 other than the ultrasonic connection section 72 and the laser-welded section 74 may be the same as those in FIG. 6.

In this example, the connection portion 62 includes a plurality of laser-welded sections 74. In FIG. 13, the connection portion 62 includes two laser-welded sections 74 (laser-welded sections 74-5 and 74-6). The longitudinal direction of the laser-welded section 74-5 is substantially parallel to the Y-axis direction. The longitudinal direction of the laser-welded section 74-6 is substantially parallel to the X-axis direction. At least a portion of the laser-welded section 74-5 overlaps the ultrasonic connection section 72 when seen in a top view.

In FIG. 13, the laser-welded sections 74-5 and 74-6 intersect with each other. That is, at least a portion of the laser-welded section 74-5 overlaps the laser-welded section 74-6. Also in such a configuration, an interfacial fracture can be suppressed.

Figure 14:
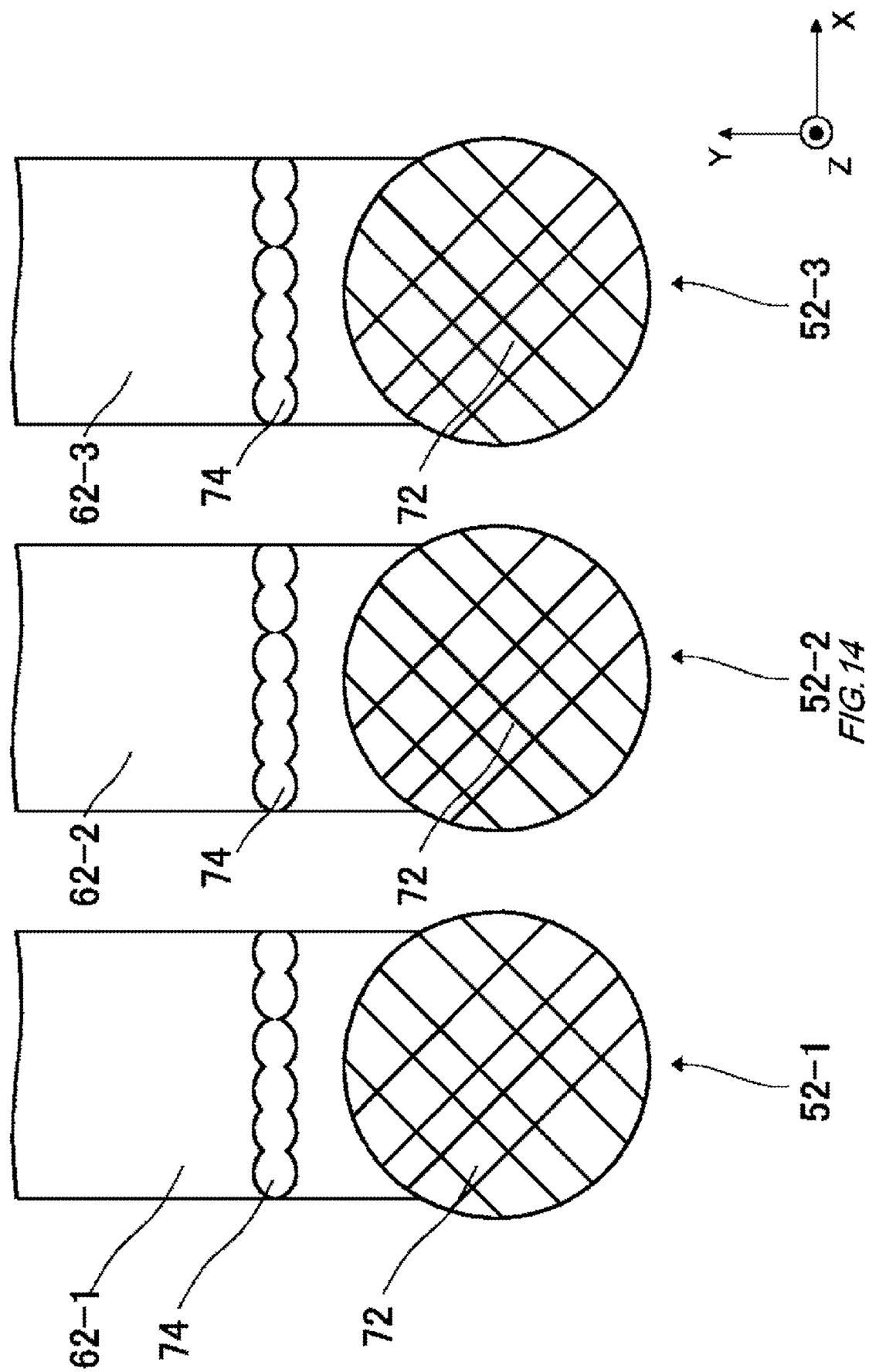
FIG. 14 shows an example of the positioning of connection portions 62 of connection terminals 52 as seen in a top view.

FIG. 14 shows an example of the positioning of connection portions 62 of connection terminals 52 as seen in a top view. FIG. 14 shows the positioning of the connection portions 62 of a plurality of connection terminals 52 (connection terminals 52-1, 52-2, and 52-3). The connection terminal 52-1 includes a connection portion 62-1. The connection terminal 52-2 includes a connection portion 62-2. The connection terminal 52-3 includes a connection portion 62-3. The connection terminals 52 may be connected to one external connection part 50 or may each be connected to a different external connection part 50. The plurality of connection terminals 52 are arranged in parallel.

The connection portions 62 each include a laser-welded section 74. In this example, the laser-welded sections 74 provided on the connection portions 62 each extend on a straight line. In FIG. 14, the laser-welded sections 74 provided on the connection terminals 52 each extend in the X-axis direction. Since each of the laser-welded sections 74 extends on a straight line, the plurality of laser-welded sections 74 can be continuously provided without changing the positioning of the semiconductor module 100.

Figure 15:
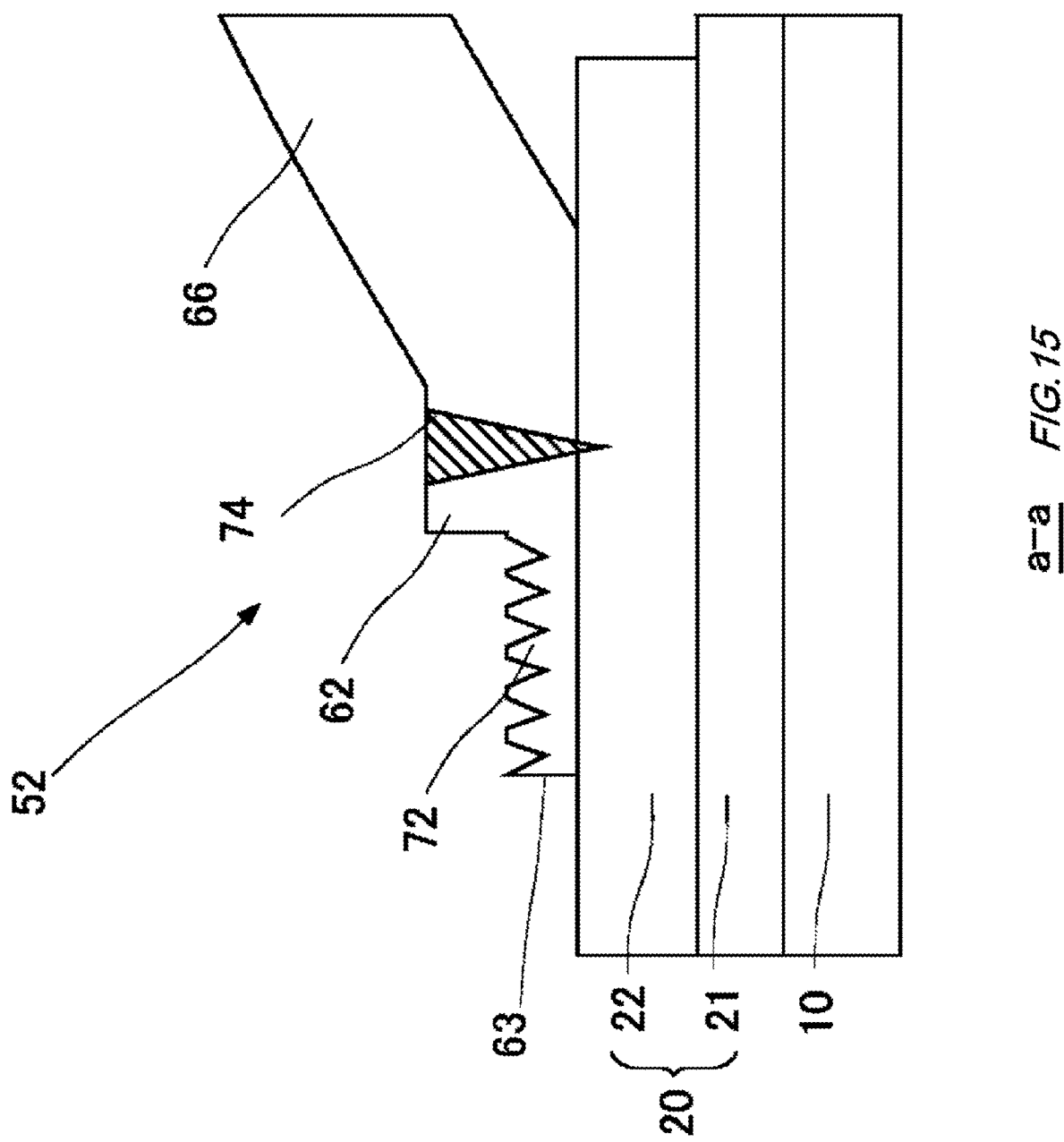
FIG. 15 shows another example of the a-a cross section of FIG. 2.

FIG. 15 shows another example of the a-a cross section of FIG. 2. FIG. 15 is different from FIG. 5 in that the connection terminal 52 does not include a leg section. Otherwise, the configurations in FIG. 15 may be the same as those in FIG. 5.

In this example, since the connection terminal 52 does not include a leg section, the extension section 66 extends in the Z-axis direction in addition to the X-axis direction. Even though the connection terminal 52 is configured like this, the connection terminal 52 can be electrically connected to an external connection part 50.

Figure 16:
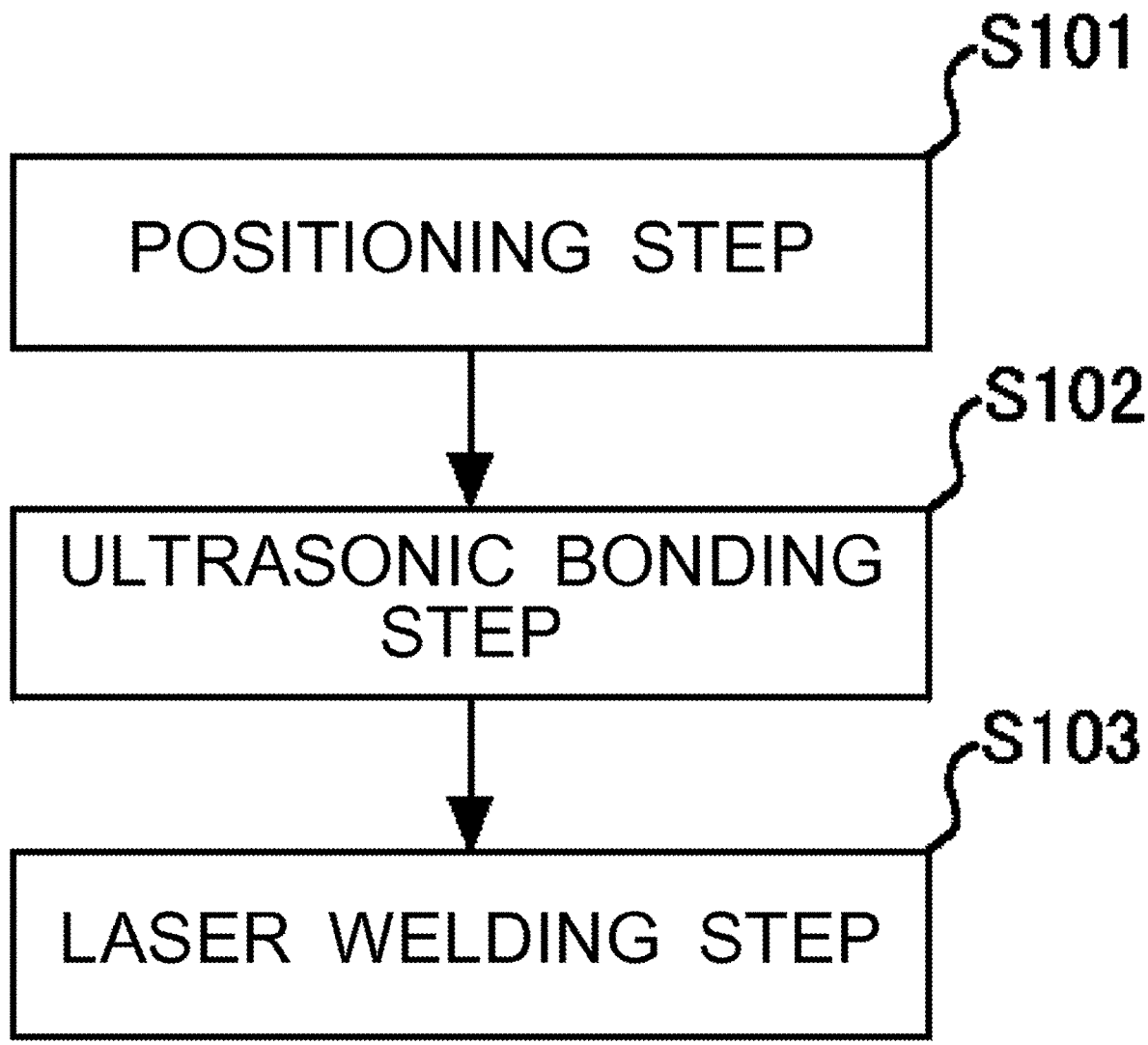
FIG. 16 shows an example of a method for forming the semiconductor module 100.

FIG. 16 shows an example of a method for forming the semiconductor module 100. The method for forming the semiconductor module 100 includes a positioning step S101, an ultrasonic bonding step S102, and a laser welding step S103.

In the positioning step S101, the connection terminal 52 is positioned. The connection terminal 52 is positioned above the layered substrate 20. In the positioning step S101, the connection terminal 52 may be supported by an external supporting platform.

In the ultrasonic bonding step S102, the ultrasonic connection section 72 is provided on the connection portion 62 of the connection terminal 52 by using ultrasonic waves. In the ultrasonic bonding, a vibrator applies ultrasonic vibrations to bonding faces, such that the bonding faces rub against each other and are thus plastically deformed to be bonded to each other. In the ultrasonic bonding, ultrasonic waves may be applied using another publicly known method.

In the laser welding step S103, the laser-welded section 74 is provided on the connection portion 62 of the connection terminal 52 by laser welding. In the laser welding, laser light is collected to irradiate a metal so as to locally melt the metal, and then the melted metal is solidified for welding. The ultrasonic bonding is performed by a vibrator applying ultrasonic vibrations, so the laser welding step S103 is preferably performed after the ultrasonic bonding step S102.

Figure 17:
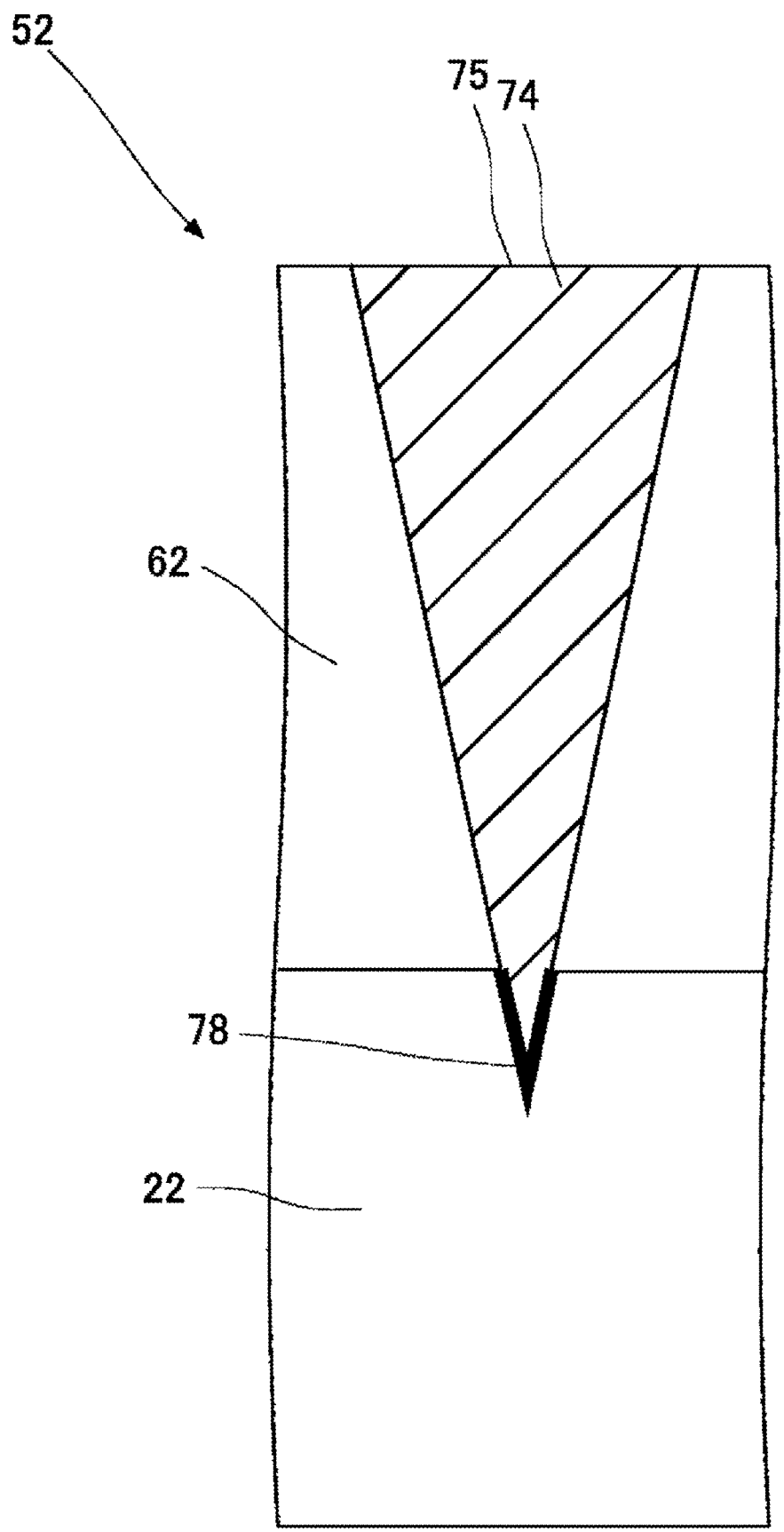
FIG. 17 shows the vicinity of a laser-welded section 74 in FIG. 5.

FIG. 17 shows the vicinity of the laser-welded section 74 in FIG. 5. FIG. 17 depicts the connection portion 62 of the connection terminal 52 and the metal plate 22. The laser-welded section 74 includes a connection face 78, which is indicated by a thick line in FIG. 17. In the example of FIG. 17, the connection face 78 is inclined with respect to the horizontal direction, as described above.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:
1. A semiconductor module comprising:
    a layered substrate on which a semiconductor chip is provided; and a connection terminal including a connection portion connected to the layered substrate, wherein
the connection portion includes
at least one ultrasonic connection section, and
a plurality of laser-welded sections sandwiching the at least one ultrasonic connection section when seen in a top view, at least a portion of which is provided at a location other than a location at which the at least one ultrasonic connection section is provided.

2. The semiconductor module according to claim 1, wherein
the at least one ultrasonic connection section is provided to be closer to a leading end of the connection portion than the plurality of laser-welded sections is.

3. The semiconductor module according to claim 1, wherein
the plurality of laser-welded sections is provided to be closer to a leading end of the connection portion than the at least one ultrasonic connection section is.

4. The semiconductor module according to claim 2, wherein
the plurality of laser-welded sections are provided on a side opposite to the leading end of the connection portion with reference to the ultrasonic connection section.

5. The semiconductor module according to claim 4, wherein
the closer to the side opposite to the leading end of the connection portion the plurality of laser-welded sections is provided, the deeper a hole of each of the plurality of laser-welded sections becomes.

6. The semiconductor module according to claim 1, wherein
the connection terminal further includes a leg section extending in a height direction, and
a longitudinal direction of the plurality of laser-welded sections is inclined with respect to a direction to connect a leading end of the connection portion and the leg section.

7. The semiconductor module according to claim 2, wherein
the connection terminal further includes a leg section extending in a height direction, and
a longitudinal direction of the plurality of laser-welded sections is inclined with respect to a direction to connect a leading end of the connection portion and the leg section.

8. The semiconductor module according to claim 1, wherein
the connection terminal further includes a leg section extending in a height direction, and
a longitudinal direction of the plurality of laser-welded sections is substantially parallel to a direction to connect a leading end of the connection portion and the leg section.

9. The semiconductor module according to claim 2, wherein
the connection terminal further includes a leg section extending in a height direction, and
a longitudinal direction of the plurality of laser-welded sections is substantially parallel to a direction to connect a leading end of the connection portion and the leg section.

10. The semiconductor module according to claim 8, wherein
the connection portion includes two of the plurality of laser-welded sections, and
the two laser-welded sections intersect with each other.

11. The semiconductor module according to claim 1, wherein
at least a portion of the plurality of laser-welded sections overlap the ultrasonic connection section when seen in a top view.

12. The semiconductor module according to claim 2, wherein
at least a portion of the plurality of laser-welded sections overlap the ultrasonic connection section when seen in a top view.

13. The semiconductor module according to claim 11, wherein
any of the plurality of laser-welded sections includes
a first portion overlapping the ultrasonic connection section when seen in a top view, and
a second portion not overlapping the ultrasonic connection section when seen in a top view, and
a hole in the second portion is deeper than a hole in the first portion.

14. The semiconductor module according to claim 1, wherein
the ultrasonic connection section includes recesses and projections on a surface of the connection portion.

15. The semiconductor module according to claim 2, wherein
the ultrasonic connection section includes recesses and projections on a surface of the connection portion.

16. The semiconductor module according to claim 1, comprising:
a plurality of the connection terminals, wherein
the plurality of laser-welded sections provided on the connection portions of the connection terminals each extend on a straight line.

17. The semiconductor module according to claim 2, comprising:
a plurality of the connection terminals, wherein
the plurality of laser-welded sections provided on the connection portions of the connection terminals each extend on a straight line.

18. A method for fabricating a semiconductor module including
a layered substrate on which a semiconductor chip is provided, and
a connection terminal including a connection portion connected to the layered substrate, the method comprising:
achieving an ultrasonic connection by providing an ultrasonic connection section in the connection portion by using ultrasonic waves; and
after the achieving the ultrasonic connection, achieving laser welding by providing a plurality of laser-welded sections sandwiching the ultrasonic connection when seen in a top view in the connection portion by the laser welding, wherein
at least a portion of the plurality of laser-welded sections is provided at a location other than a location at which the ultrasonic connection section is provided.

* * * * *